(12) United States Patent
Kimura

(10) Patent No.: US 6,392,278 B1
(45) Date of Patent: May 21, 2002

(54) FET HAVING A RELIABLE GATE ELECTRODE

(75) Inventor: Shingo Kimura, Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/603,192

(22) Filed: Jun. 26, 2000

(30) Foreign Application Priority Data

Jun. 28, 1999 (JP) .......................................... 11-181928

(51) Int. Cl.⁷ ........................ H01L 29/76; H01L 21/338
(52) U.S. Cl. ........................ 257/401; 257/202; 257/365; 438/574; 438/579; 438/182
(58) Field of Search ................................. 438/574, 579, 438/182; 257/327, 330–332, 334, 341, 401, 280–284, 202–211, 365, 773, 775

(56) References Cited

U.S. PATENT DOCUMENTS

| 3,961,350 A | * | 6/1976 | Tiefert .......................... 257/484 |
| 4,206,469 A | * | 6/1980 | Hanes et al. ................. 257/341 |
| 4,829,014 A | * | 5/1989 | Yerman .......................... 438/6 |
| 4,829,347 A | * | 5/1989 | Cheng et al. ................. 257/192 |
| 4,965,218 A | * | 10/1990 | Geissberger et al. ........ 438/182 |
| 5,019,877 A | * | 5/1991 | Hosogi ......................... 257/282 |
| 5,283,457 A | * | 2/1994 | Matloubian .................. 257/351 |
| 5,334,542 A | * | 8/1994 | Saito et al. .................. 438/579 |
| 5,436,489 A | * | 7/1995 | Murase ......................... 257/401 |
| 5,731,614 A | * | 3/1998 | Ham ............................. 257/355 |
| 5,734,188 A | * | 3/1998 | Murata et al. ............... 257/401 |
| 5,789,791 A | * | 8/1998 | Bergemont .................. 257/401 |
| 5,923,072 A | * | 7/1999 | Wada et al. .................. 257/473 |
| 6,020,613 A | * | 2/2000 | Udomoto et al. ........... 257/341 |
| 6,023,086 A | * | 2/2000 | Reyes et al. ................. 257/341 |

FOREIGN PATENT DOCUMENTS

JP 5-190573 7/1993

* cited by examiner

Primary Examiner—Eddie Lee
Assistant Examiner—José R. Diaz
(74) Attorney, Agent, or Firm—McGinn & Gibb, PLLC

(57) ABSTRACT

A comb-shape MESFET has a gate electrode having a plurality of gate fingers coupled to a gate bar at the proximal ends of the gate fingers. The distal end of each gate finger is formed as a large width end on the inactive region of the wafer. The large width end prevents peel-off of the gate finger from the semiconductor layer, thereby improving reliability of the structure of the comb-shape MESFET.

10 Claims, 4 Drawing Sheets

FET HAVING A RELIABLE GATE ELECTRODE

BACKGROUND OF THE INVENTION (a) Field of the Invention

The present invention relates to a field effect transistor (FET) having a reliable gate electrode and, more particularly, to the structure of a FET adapted for use in a short wavelength range such as on the order of millimeters.

(b) Description of the Related Art

Active components such as FETs capable of operating in a shorter wavelength range have increased demands. FETs made of III–V group compound semiconductors have higher operational speeds or operate, in a higher frequency range compared to FETs made of silicon due to a higher travelling speed of electrons in the compound semiconductors. Thus, FETs made of III–V group compound semiconductors such as GaAs, especially MESFETs having Schottky junctions, are developed in these days.

In general, the operational speed of the FET depends on the velocity of the carriers passing just below the gate electrode of the FET. Thus, the pursuit of a higher speed in the FET inevitably leads to reduction of the gate length thereof.

The gate electrode generally assumes a profile of character "T" or mushroom in the cross-section thereof for reduction of the input resistance, wherein the top portion of the gate electrode is thicker or larger compared to the bottom portion where the gate electrode contacts with a semiconductor layer. In addition, the gate electrode may have a width of as large as several hundreds of; micrometers for achieving a higher output power. In this case, the gate electrode is generally divided into a plurality of portions each having a width of 5 to 110 $\mu$m, thereby alleviating the phase delay of the input signal. These portions are arranged in a so-called comb shape, and such FET is called comb-shape FET.

FIG. 1 shows the structure of a conventional comb-shape FET, wherein the dimensions in the figure are not shown to scale. In FIG. 1, a rectangular active region 31 is surrounded by an inactive region 32 on a GaAs substrate. The comb-shape gate electrode 33 has a plurality of gate fingers 33a extending across the active region 31 in parallel to one another. The proximal ends of the gate fingers 33a are coupled to a gate bar 33b having a larger width and disposed in the inactive region 32 in the vicinity of the boundary between the inactive region 32 and the active region 31.

A source ohmic electrode 34 and a drain ohmic electrode 35 are disposed in the active region 31, sandwiching therebetween each of the gate fingers 33a. A source lead 36 is of a comb-shape, and has a source lead bar 36b overlying the inactive region 32 and a plurality of source lead fingers 36a each extending from the source lead bar 36b. A drain lead 37 is of a comb-shape, and has a drain lead bar 37b overlying the inactive region 32 and a plurality of drain lead fingers 37a each connected to the drain lead bar 37b. Each source lead finger 36a is in ohmic contact with a corresponding source ohmic electrode 34, and each drain lead finger 37a is in ohmic contact with a corresponding drain ohmic electrode 35.

FIGS. 2A to 2D are sectional views of the FET of FIG. 1, showing consecutive steps of fabrication thereof. These figures are taken along line II—II in FIG. 1.

In fabrication of the MESFET of FIG. 1, an n-type GaAs layer 11 acting as a channel layer is grown on a semi-insulating GaAs substrate 10, followed by growth of an $n^+$-type GaAs contact layer 12 thereon. After covering a portion of the $n^+$-type GaAs contact layer 12 to be formed as the active region 31 by a first photoresist mask, boron ions, for example, are implanted to form a semi-insulating inactive region 32 for isolation of active regions 31, as shown in FIG. 2A.

A second photoresist mask is then formed having an opening for exposing the region in which a gate electrode is to be disposed. The dimensions of the opening are larger than the dimensions of the region at which the gate electrode contacts with the GaAs wafer. By using the second photoresist mask, a dry etching process is conducted to form a recess 14 in the $n^+$-type GaAs layer 12, the recess 14 having a bottom within the top portion of the n-type GaAs layer 11. A silicon oxide film 15 having a specified thickness is then deposited on the entire surface by using a chemical vapor deposition (CVD) technique. The specified thickness is selected depending on the height of the foot of the mushroom shape;to be formed later.

A third photoresist mask is then formed having an opening for exposing the region at which the gate electrode is to be formed. The dimensions of the opening define the gate length "L". By using the third photoresist mask, the silicon oxide film 15 is etched to form a groove 16 by using a dry etching technique, as shown in FIG. 2B.

Thereafter, an etching process is conducted to remove a damage layer formed on the surface of the n-type GaAs layer 11 in the previous step. A sputter-deposition is then conducted to form an underlying layer 18 including a bottom WSi film and a top TiN barrier film, followed by another sputter-deposition of thick Au film 19 and a thin TiN film (not shown). The WSi layer in the underlying layer 18 is used for forming a Schottky characteristic, whereas the TiN film acts as a barrier layer against the overlying Au film 19 of the gate electrode. Subsequently, consecutive ion-milling and reactive ion etching steps are conducted for etching the TiN layer, the Au film 19 and the underlying layer 18, to form the gate electrode 33 including gate fingers 33a each having a mushroom shape, as shown in FIG. 2C.

The silicon oxide film 15 is then removed by etching, followed by CVD of a gate protective film 20 made of silicon oxide. Then, a fourth photoresist mask is formed having openings corresponding to the source and drain ohmic electrodes 34 and 35 on both sides of each gate finger 33a in the active region 31. The source and drain ohmic electrodes 34 and 35 are then formed after etching and liftoff of the gate protective film 20 by using the fourth photoresist mask. Both the ohmic electrodes 34 and 35 are formed by evaporation of AuGe and Au and a subsequent heat treatment thereof for alloying, as shown in FIG. 2D. Thereafter, source and drain leads 36 and 37 are formed in ohmic contact with the ohmic electrodes 34 and 35, followed by formation of passivation film etc. to complete the MESFET of FIG. 1.

In the MESFET as described above, with the reduction of the gate length "L" down to as low as 0.2 $\mu$m, for example, the stress acting at the interface between the semiconductor layer and the metallic film causes damages, such as peel-off or deformation of the gate fingers 33a, in the step of etching of the oxide film and subsequent steps, thereby degrading the fabrication yield of the MESFET. In particular, wet treatments, using supersonic wave for stabilizing the washing and etching effects, incur the peel-off of the gate fingers 33a from the semiconductor layer 11, especially often at the distal ends of the gate fingers 33a rather than at the proximal ends. Although the protective film 20 is provided for this purpose, the protection by the protective film 20 is insufficient unless the protective film 20 has a sufficient thickness. A thick protective film 20 however causes an increase of the gate capacitance and thus is undesirable in view of the transistor characteristics. In addition, the. peel-off of the gate finger 33a itself may occur before formation of the protective film 20.

Patent Publication JP-A-5-190573 proposes prevention of the peel-off of the gate fingers. Referring to FIG. 3 showing the detail of the proposed structure for the MESFET, the gate finger 33a extends between the source ohmic electrode 34 and the drain ohmic electrode 35 across the active region 31. The gate finger 33a having a mushroom shape in cross section extends from the gate bar 33b and has a pair of lateral projections 33c at the central part thereof, which is located in an island portion of the inactive region 32. The lateral projection 33c is 2×2 $\mu$m wide for a gate length (width of the gate finger) of 0.1 $\mu$m and a unit gate width (length of the gate finger) of 100 $\mu$m.

The structure of the gate finger shown in FIG. 3 prevents the peel-off of the elongated gate finger 33a from the semiconductor layer due to the lateral projection 33c increasing the effective mechanical-contact area. In addition, it is described that the location of the lateral projection 33c in the inactive region 32 suppresses the increase of the gate capacitance two a negligible level.

The proposed structure may effectively prevent peel-off of the gate finger 33a from the semiconductor layer. However, the prevention scarcely acts at the distal end of the elongated gate finger 33a, which is most liable to peel-off. Thus, the proposed structure is insufficient for the prevention of the peel-off. In addition, the island portion of the inactive region 32 receiving therein the lateral projection 33c reduces the effective gate width, which is undesirable.

SUMMARY OF THE INVENTION

In view of the above, it is an object of the present invention to provide a FET having a reliable gate electrode and thus capable of solving the aforementioned disadvantages involved in the conventional MESFET.

The present invention provides a FET including a substrate defining an active region and an inactive region, a source and a drain formed in the active region, a gate electrode including at least one gate finger having a first width and extending between the source and drain across the active region, the gate finger having a first end connected to a gate bar having a width larger than the first width and a second end having a width larger than the first width, both the first and second ends being formed on the inactive region.

In accordance with the FET of the present invention, the gate finger of the gate electrode is less liable to peel-off due to the large width end. In addition, the effective gate width is not reduced due to the large width end because the large width end is located on the inactive region.

The above and other objects, features and advantages of the present invention will be more apparent from the following description, referring to the accompanying drawings.

PREFERRED EMBODIMENT OF THE INVENTION

Figure 1:
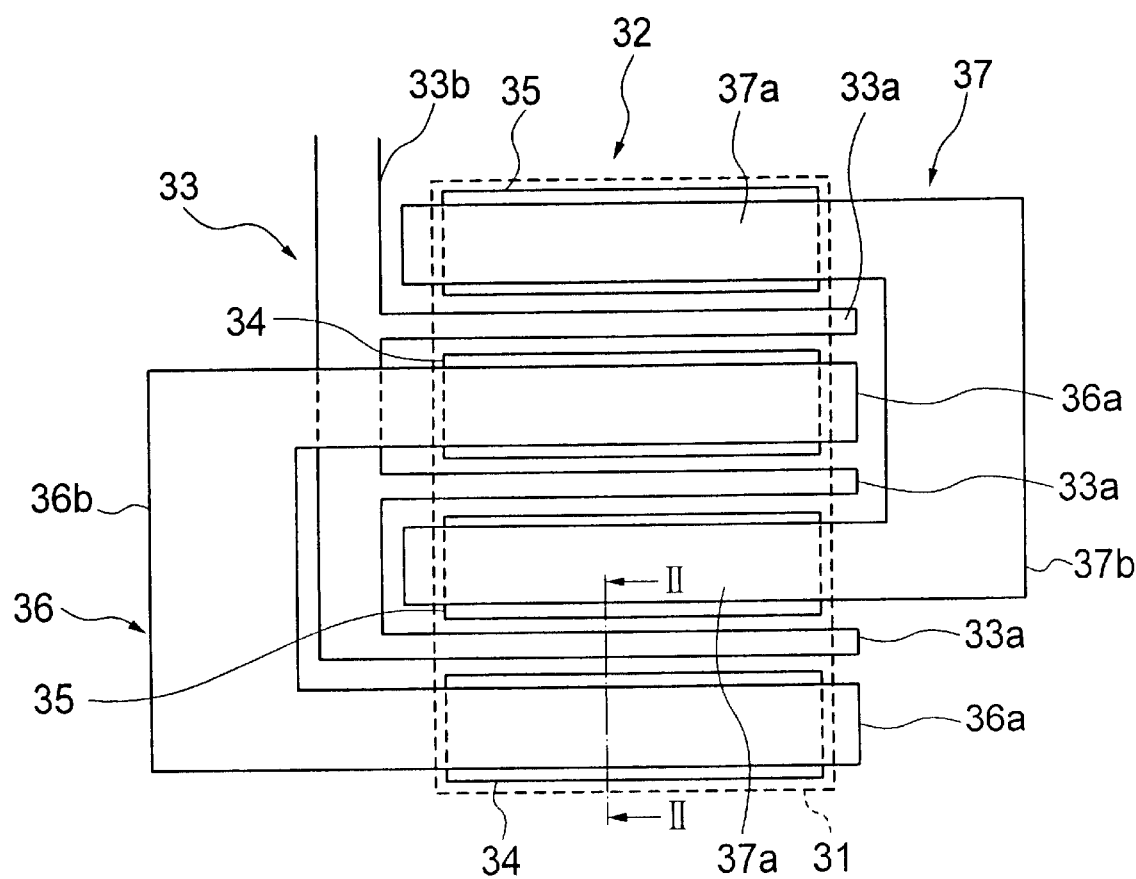
FIG. 1 is a partial top plan view of a conventional MESFET.

The present invention is applicable to any type of FETs including a MOSFET as well as a MESFET and a JFET, fabricated on a silicon substrate as well as a compound semiconductor substrate or semi-insulating substrate, such as GaAs substrate.

In a MOSFET, for example, fabricated on a silicon substrate, the active area corresponds to a doped region of the silicon substrate whereas the inactive region corresponds to the area covered as by a field oxide film, which isolates the active areas into isolated active regions each for receiving therein the MOSFET. The field oxide film generally has a sufficient thickness for preventing an electrical interaction between interconnects overlying the field oxide film and the portion of the silicon substrate underlying the field oxide film.

In a MESFET, for example, formed on a III–V group compound semiconductor substrate, such as a GaAs semi-insulating substrate, a channel layer such as n-type GaAs channel layer is epitaxially grown on a GaAs substrate. The channel layer is subjected to a selective ion-implantation of oxygen, boron etc. at the surface portion thereof, or subjected to mesa-etching to expose a portion of the semi-insulating substrate, thereby forming an inactive region selectively from an active region. The inactive region of this type also acts suppression of an electrical interaction between the interconnects overlying the inactive region and the active region.

More specifically, the present invention is applicable to a FET having a gate finger or a gate line extending across the active region or active area. The present invention is applicable especially to a FET having a short gate length which is liable to peel-off from underlying film, or a FET having a gate finger made of a material which is liable to peel-off after generation of crack therein.

The gate finger generally has a mushroom shape wherein the top portion is thicker compared to the bottom portion, which shape suppresses the, increase of the electrical impedance along the gate width of the FET. The mushroom shape may be called T-shape or Y-shape instead. The mushroom shape includes herein L-shape wherein only a side of the gate finger near one of the source and drain has such a structure wherein the top portion is thicker than the bottom portion. The term "gate finger" as used herein includes one of the gate fingers coupled to a single gate bar as well as a single gate electrode (line) having a small width and extending across the active region. The gate finger has both ends each connected to a wide bar or pad formed on the inactive region, and extends therebetween across the active region.

The active region is separated by the gate finger into a pair of sub-regions acting as source and drain. The structure of the source and drain itself may be formed before and after the formation of the gate fingers.

Now, the present invention is more specifically described with reference to accompanying drawings, wherein similar constituent elements are designated by related reference numerals throughout the drawings.

Figure 4:
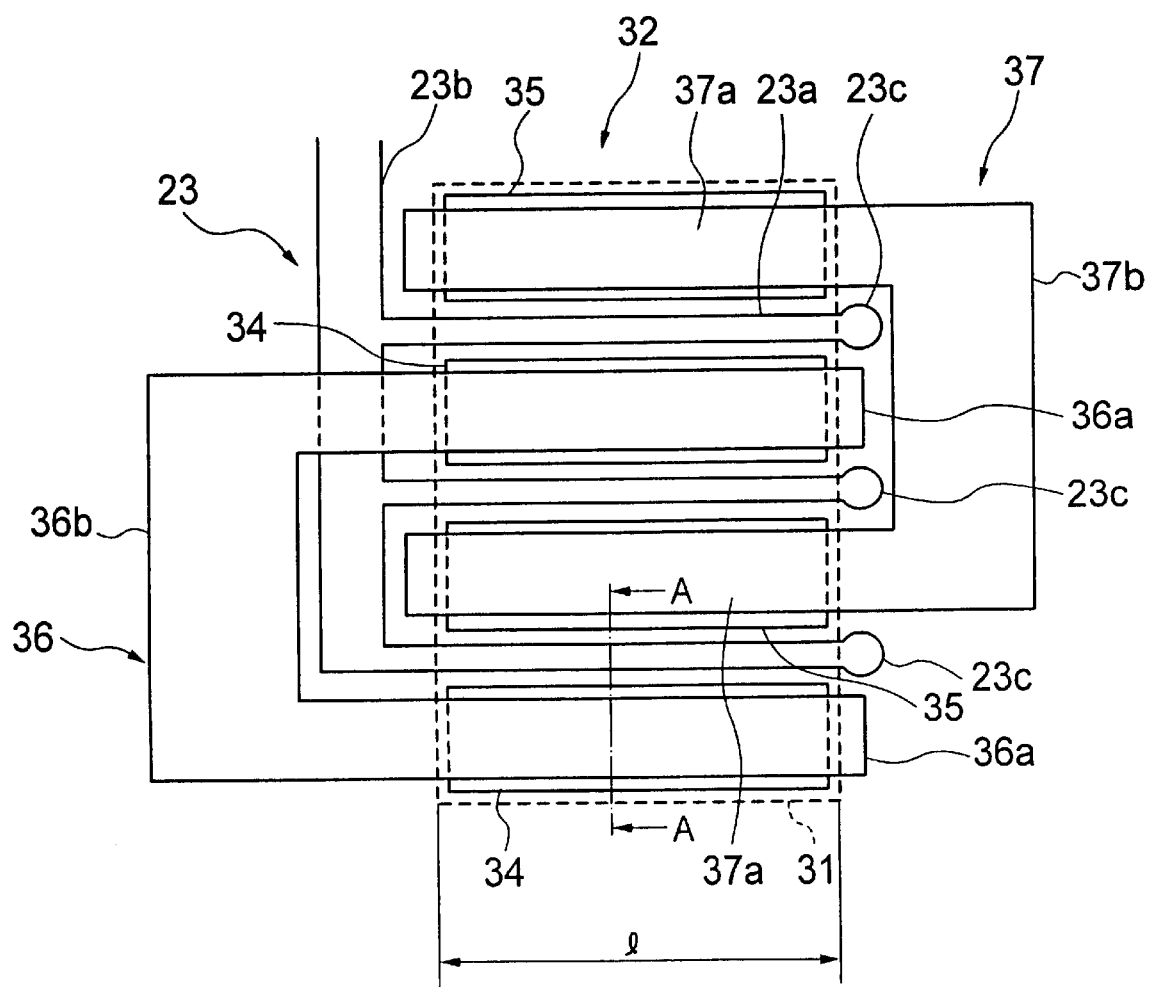
FIG. 4 is a partial top plan view of a MESFET according to an embodiment of the present invention.

Referring to FIG. 4, a MESFET according to an embodiment of the present invention is similar to the conventional MESFET described with reference to FIG. 1 except for the structure 23c of the distal end of each gate finger 23a.

More specifically, in FIG. 4, a rectangular active region 31 is surrounded by an inactive region 32 on a GaAs substrate. The comb-shape gate electrode 23 has a plurality of gate fingers 23a extending across the active region 31 in parallel to one another. The proximal ends of the gate fingers 23a are coupled to a gate bar 23b having a larger width and disposed in the inactive region in the vicinity of the boundary between the inactive region 32 and the active region 31.

A source ohmic electrode 34 and a drain ohmic electrode 35 are disposed in the active region 31, sandwiching therebetween each of the gate fingers 23a. A source lead 36 is of a comb-shape, and has a source lead bar 36b overlying the inactive region 32 and a plurality of source lead fingers 36a each extending from the source lead bar 36b. A drain lead 37 is of a comb-shape, and has a drain lead bar 37b overlying the inactive region 32 and a plurality of drain lead fingers 37a each connected to the drain lead bar 37b. Each source lead finger 36a is in ohmic contact with a corresponding source ohmic electrode 34, and each drain lead finger 37a is in ohmic contact with a corresponding drain ohmic electrode 35.

Figure 3:
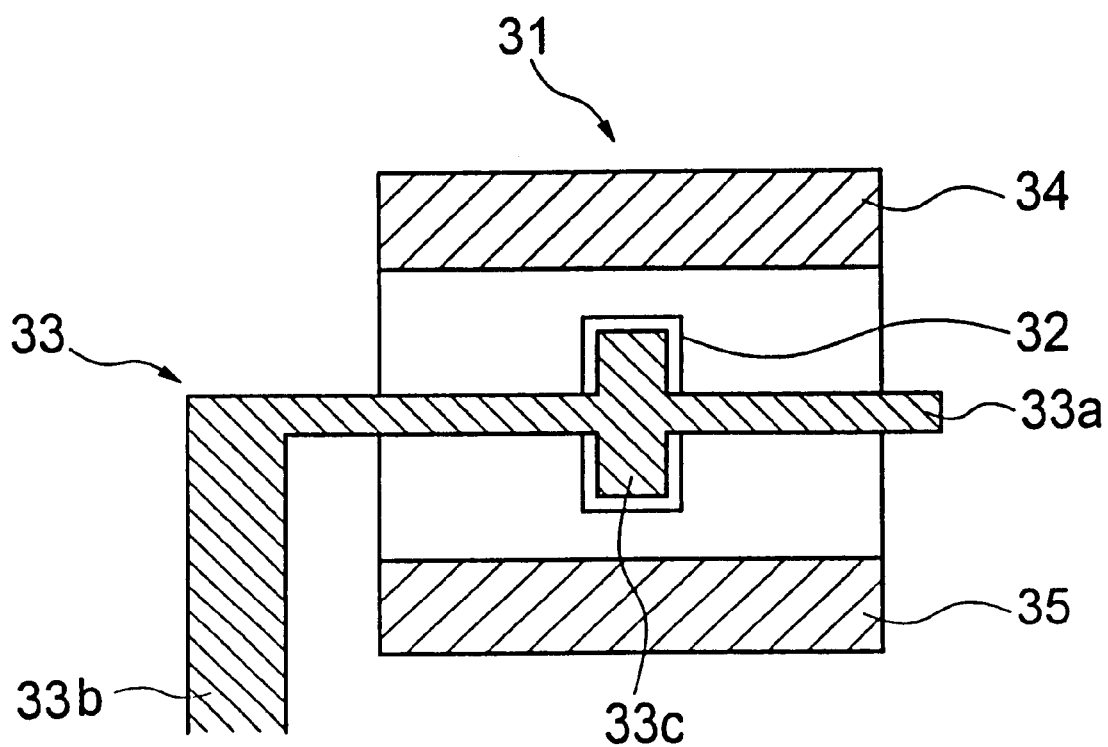
FIG. 3 is a detailed top plan view of another conventional MESFET described in a publication.

The distal end 23c of the gate finger 23a is formed as a large-width end or circular end which has a larger width (or diameter) than the width of the other portion of the gate finger 23a. The distal end 23c may have lateral extensions 33c such as shown in FIG. 3 instead.

The circular distal end 23c formed on the inactive region 32 is less liable to peel-off and prevents the gate finger 23 from peeling-off from the semiconductor layer. The size of the circular distal end 23c should be selected by experiments while applying a supersonic wave thereto for each material or structure of the gate finger 23a.

The length of the gate finger 23a (or unit gate width) is preferably limited to a length which suppresses the phase delay of a high-frequency signal used down to an allowable level. The practical length of the gate finger 23a is 5 to 110 $\mu$m, for example, based on which the width of the active region 31 is selected.

In a practical example of the embodiment shown in FIG. 4, the length of the gate finger 23a was about 100 $\mu$m for a gate length of 0.2 $\mu$m. The gate finger 23a included a bottom WSi film and a top Au film, which were configured to have a mushroom shape. The diameter of the circular distal end 23c at the location where the distal end 23c contacted with the substrate was selected at 2 $\mu$m after repeated experiments for avoiding occurrence of the peel-off.

For avoiding contact between the circular distal end 23c and the drain lead bar 37b of the drain lead 37, the location of the drain lead bar 37b is shifted away from the boundary between the active region 31 and the inactive region 32.

Figure 2A:
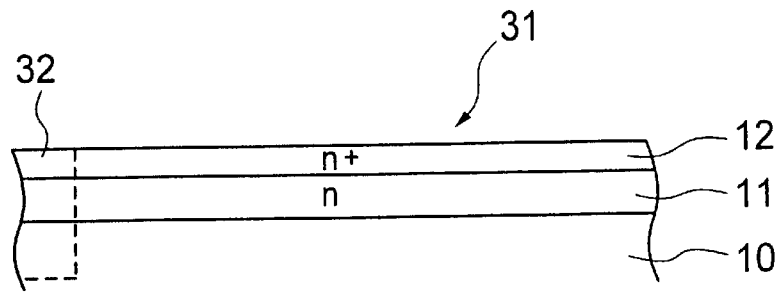
FIGS. 2A to 2D are sectional view for showing consecutive steps of fabrication of the MESFET of FIG. 1 as well as FIG. 4, taken along II—II in FIGS. 1 and 4.
Figure 2B:
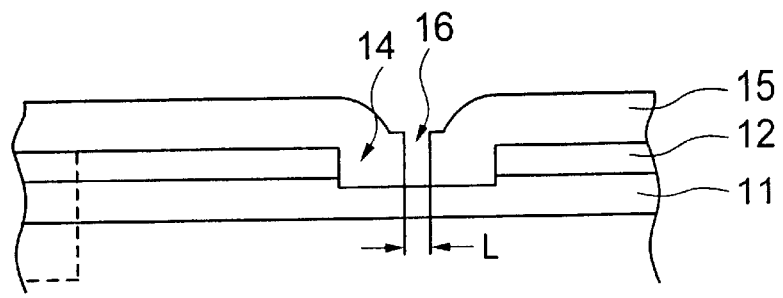
Figure 2C:
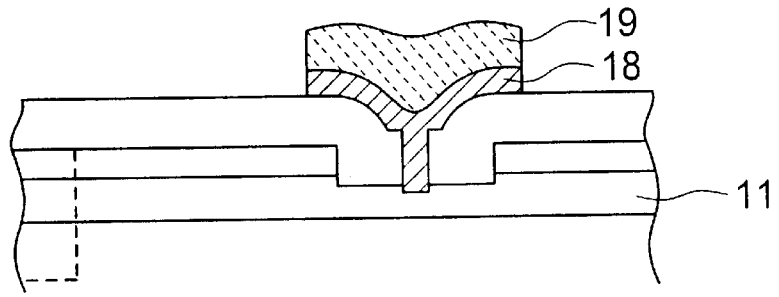
Figure 2D:
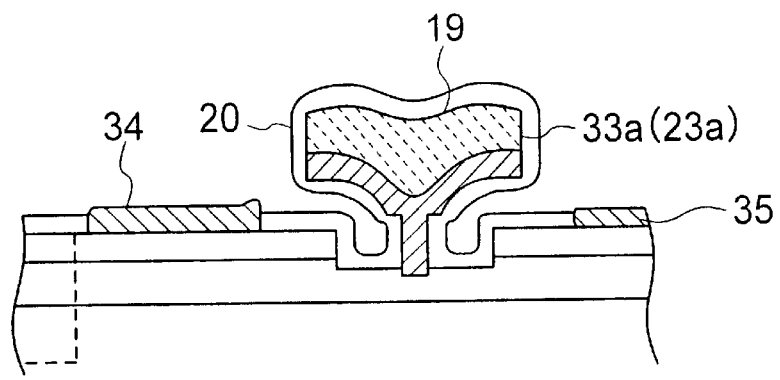

FIGS. 2A and 2D also show consecutive steps of fabrication of the MESFET of FIG. 4. These figures are taken along line A—A in FIG. 4.

In fabrication of FET of FIG. 4, an n-type GaAs layer 11 acting as a channel layer is grown on a semi-insulating GaAs substrate 10, followed by growth of an n$^+$-type GaAs contact layer 12 for source and drain, thereby obtaining a wafer. After covering a portion of the wafer to be formed as the active region 31 by a first photoresist mask, boron ions (B$^+$), for example, are implanted to form a semi-insulating inactive region 32 for isolation of active regions 31, as shown in FIG. 2A. Alternatively, the inactive region may be formed by selectively etching the n+-type GaAs layer 12 and the n-type GaAs layer 11 by using a mesa-etching technique to expose a portion of the surface of the semi-insulating GaAs substrate 10.

A second photoresist mask is then formed having an opening for exposing the region in which a gate electrode including the gate fingers 23a, the gate bar 23b and the circular distal end 23c is to be disposed. The dimensions of the opening are larger than the dimensions of the region at which the gate electrode contacts with the GaAs wafer. By using the second photoresist mask, a dry etching process is conducted to form a recess 14 in the n$^+$-type GaAs layer 12, the recess 14 having a bottom within the top portion of the n-type GaAs layer 11. The remaining portion of the n$^+$-type GaAs layer in the active region 31 later acts as source and drain. A silicon oxide film 15 having a specified thickness is then deposited on the entire surface by a CVD technique. The specified thickness is selected depending on the height of the foot of the mushroom gate finger to be formed later.

A third photoresist mask is then formed having an opening for exposing the region at which the gate electrode is to be formed. The dimensions of the opening define the gate length "L". By using the third photoresist mask, the silicon oxide film 15 is selectively etched to form a groove 16, as shown in FIG. 2B. The gate length is selected at 0.2 $\mu$m in this example.

Thereafter, an etching process is conducted to remove a damage layer formed on the exposed portion of the n-type GaAs layer 11 in the previous step. A sputter-deposition is then conducted to form an underlying layer 18 for the gate electrode including a bottom WSi film and a top TiN barrier layer, followed by another sputter-etching to form a thick Au film 19 and an overlying thin TiN film (not shown). The WSi layer in the underlying layer 18 is used for forming a Schottky characteristic, whereas the TiN film in the underlying layer 18 acts as a barrier against the overlying Au film 19. Subsequently, consecutive ion-milling and reactive ion etching steps are conducted for etching the TiN film, Au film 19 and the underlying layer 18 to forms the gate electrode 33 including the gate bar 23b and the gate fingers 33a each having a mushroom shape, as shown in FIG. 2C.

The photoresist mask and the silicon oxide film 15 are then removed by etching, followed by CVD of silicon oxide to form a gate protective film 20. Then, a fourth photoresist mask is formed having openings corresponding to the source and drain ohmic electrodes on both sides of the gate fingers in the active region 31. The source and drain ohmic electrodes 34 and 35 are then formed after etching and liftoff of the gate protective film 20 by using the fourth photoresist mask. Both the ohmic electrodes 34 and 35 are formed by evaporation of AuGe and Au and heat treatment thereof for alloying, as shown in FIG. 2D. Thereafter, source and drain leads 36 and 37 are formed in ohmic contact with the ohmic electrodes 34 and 35, followed by formation of passivation film etc. to complete the MESFET.

The MESFET formed by the above process has advantages in that the gate length can be formed small, and that the gate finger is less liable to peel-off due to the fixing thereof at both the ends.

Since the above embodiments are described only for examples, the present invention is not limited to the above embodiments and various modifications or alterations can be easily made therefrom by those skilled in the art without departing from the scope of the present invention.

What is claimed is:

1. A field effect transistor (FET) comprising:
   a substrate having an active region and an inactive region;
   a source and a drain formed in the active region; and
   a gate electrode comprising a gate bar and at least one gate finger, each said at least one gate finger extending between said source and drain across said active region, each said at least one gate finger having a first end with a first width connected to said gate bar and a second end having a width larger than said first width, both said first and second ends being formed on the inactive region, and said gate bar having a width larger than said first width.

2. The FET as defined in claim 1, wherein said FET comprises a comb-shape FET and said gate electrode includes a plurality of ones of said at least one gate finger.

3. The FET as defined in claim 1, wherein said second end has a curved periphery.

4. The FET as defined in claim 1, wherein said second end is circular.

5. The FET as defined in claim 1, wherein said at least one gate finger has a top portion thicker than a bottom portion.

6. A field effect transistor (FET) comprising:
   a source;
   a drain; and
   a gate electrode comprising a gate bar and at least one gate finger, each said at least one gate finger having a proximal end connected to said gate bar, wherein said gate bar serves as a device gate electrode interface and said at least one gate finger provides a gate structure between said source and said drain, said gate bar having a first width, each said at least one gate finger having a first portion extending between said source and said drain and a second portion outside said first portion, each said at least one gate finger having in said first portion a second width smaller than said first width and in said second portion a third width larger than said second width.

7. The field effect transistor (FET) of claim 6, wherein said second end of each of said at least one gate finger is located in a region of said FET that is inactive for said source and said drain.

8. A field effect transistor (FET) having a gate, said gate comprising:
   a gate bar serving as a device gate electrical interface, said gate bar having a first width; and
   at least one gate finger, each said at least one gate finger having a proximal end attached to said gate bar and a distal end, wherein said proximal end has a second width smaller than said first width of said gate bar and said distal end has a third width larger than said second width.

9. The field effect transistor of claim 8, wherein said proximal end width comprises a width of a rectangular shape and said distal end width comprises a width of essentially a geometrical shape extending off said rectangular shape.

10. The field effect transistor of claim 9, wherein said geometrical shape comprises one of a:
   square;
   rectangle;
   circle;
   ellipse; and
   polygon.

* * * * *